United States Patent

Tangen

[19]

[11] Patent Number: 5,805,984
[45] Date of Patent: Sep. 8, 1998

[54] METHOD AND APPARATUS FOR ELIMINATING FREQUENCY MISMATCH BETWEEN A TRANSMITTER AND A RECEIVER

[75] Inventor: Wayne A. Tangen, Buford, Ga.

[73] Assignee: Motorola, Inc., Schaumburg, Ill.

[21] Appl. No.: 610,916

[22] Filed: Mar. 5, 1996

[51] Int. Cl.⁶ .................................................. H04B 7/26
[52] U.S. Cl. .................... 455/71; 455/67.4; 455/192.2; 455/255; 455/264; 375/344
[58] Field of Search .................. 455/68, 70, 71, 455/67.1, 67.4, 316, 151.1, 265, 255, 264, 192.1, 192.2; 375/285, 276, 278, 296, 297, 319, 346, 344; 331/1 R; 329/318

[56] References Cited

U.S. PATENT DOCUMENTS 5,115,515  5/1992  Yamamoto et al. ..................... 455/71
5,249,305  9/1993  Wieczorek et al. ..................... 455/54.2
5,461,645  10/1995  Ishii ........................................ 375/344
5,488,332  1/1996  DeLoe ..................................... 331/25

FOREIGN PATENT DOCUMENTS 0311729  12/1989  Japan .

Primary Examiner—Reinhard J. Eisenzopf
Assistant Examiner—Lee Nguyen
Attorney, Agent, or Firm—Scott M. Garrett; Kenneth M. Massaroni

[57] ABSTRACT

Frequency mismatch between the carrier oscillator (18) of a radio transmitter (10) and a local oscillator (44) of a radio receiver is eliminated. The transmitter generates a mismatch correction signal (54), modulates it with the carrier, and transmits to the receiver. The receiver demodulates the received signal and generates a pulse train (52) having a duty cycle indicative of the frequency deviation. A digital logic unit (42) calculates the magnitude and direction of the frequency deviation, and adjusts the local oscillator to match the carrier frequency.

10 Claims, 3 Drawing Sheets

METHOD AND APPARATUS FOR ELIMINATING FREQUENCY MISMATCH BETWEEN A TRANSMITTER AND A RECEIVER

TECHNICAL FIELD

This invention relates in general to radio systems, and particularly to eliminating frequency mismatch between a transmitter and a receiver.

BACKGROUND

Frequency mismatch between a transmitter and a receiver is a common problem in radio communications. The conventional approach to the problem is to provide both the transmitter and receiver with highly stable oscillators of matched frequencies, then using techniques for correcting small errors such as phase-locked loop control. This method is employed by many communication systems and is a well developed technology.

However, the expense of such a system limits the applications to which it may be applied. As wireless communications are increasingly being used in low cost applications, other methods have been developed. For example, frequency discriminators are in widely used. In general, a discriminator produces an output voltage corresponding to the input frequency. As the frequency deviates, so to does the output voltage of the discriminator deviate from the nominal output voltage. To simplify the system the discriminator is designed such that its output varies approximately linearly within the frequency range of the received signal. To correct for frequency mismatch errors, the output voltage of the discriminator is measured and averaged. Once the discriminators output frequency to voltage transfer characteristics are known, the deviation of the average from the nominal output voltage indicates the error, and the receiver may make the necessary adjustment to the local oscillator frequency.

In practice this method is implemented by using an analog to digital converter (ADC) to convert the output of the discriminator to digital values, which are then used by a digital circuit, such as a microprocessor, to compute the average, then adjust the local oscillator. However, the effectiveness of this method is dependent on the resolution of the ADC. Typically 10 and 12 bit ADCs are employed, but depending on the system, it is conceivable to use 8 bit ADCs. Regardless of the resolution of the ADC, its inclusion represents a significant cost, especially in low cost applications such as, for example, automated meter reading systems, and other such systems which as mass produced. Therefore, there exists a need for a means by which frequency mismatch between a transmitter and a receiver in a radio system may be reliably eliminated in a cost effective manner.

DETAILED DESCRIPTION OF THE PREFERRED EMBODIMENT

Figure 1:
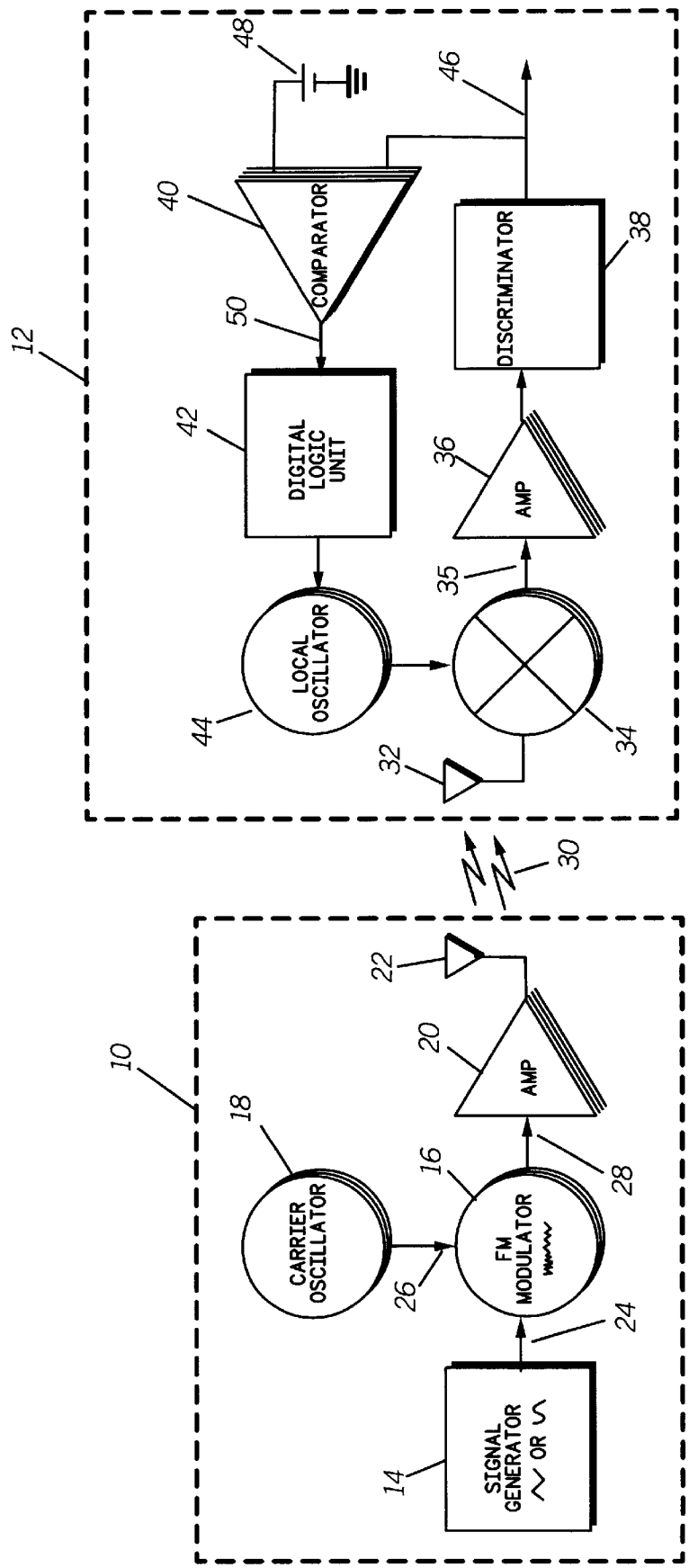
FIG. 1 is a block diagram of an apparatus for eliminating frequency mismatch, including a radio receiver, in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a block diagram of an apparatus for eliminating frequency mismatch between a radio transmitter 10 and a radio receiver 12 in accordance with the invention. The transmitter comprises a signal generator 14, FM modulator 16, carrier oscillator 18, amplifier 20, and a transmitter antenna 22. The signal generator 14 is responsible for providing the signal to be transmitted, including an information signal such as voice or data. However, to allow the receiver to match the frequency of the transmitter, the signal generator first generates a mismatch correction signal, which is preferably a triangle wave or a sinusoidal wave. The mismatch correction signal is fed to the FM modulator 16 on line 24 where it is used to modulate the carrier frequency $f_c$ provided by the carrier oscillator 18 on line 26. The FM modulator provides a modulated mismatch correction signal on line 28, which is fed to the amplifier 20, and transmitted to the receiver 12 via a wireless channel 30 by the transmitter antenna 22.

The receiver 12 is typically a heterodyne receiver and comprises a receiver antenna 32, receiver mixer 34, receiver amplifier 36, discriminator 38, comparator 40, digital logic unit 42, and a local oscillator 44. The local oscillator 44 is adjustable, and responsive to the digital logic unit 42. The modulated mismatch correction signal is received by the receiver antenna 32 from the wireless channel 30, and fed to the receiver mixer 34. The receiver mixer mixes the modulated mismatch correction signal with the local oscillator frequency $f_{lo}$, which is initially equal to the carrier frequency $f_c$ plus a frequency error $\Delta f$, and offset from the carrier frequency by an intermediate frequency, producing a mixed mismatch correction signal on line 35. The mixed mismatch correction signal is then fed to the receiver amplifier 36 on line 35 for amplification and filtering. The amplified mixed mismatch correction signal is fed to the discriminator 38 which converts it into a demodulated mismatch correction signal on line 46. The discriminator is a well known type of frequency detector, such as a Foster-Seely discriminator, and produces a nominal output voltage when the carrier frequency $f_c$ is offset from $f_{lo}$ by the intermediate frequency and the frequency error is zero.

The demodulated mismatch correction signal is then fed to the comparator 40 on line 46. The comparator compares the demodulated mismatch correction signal with a reference voltage 48, which is equal to the nominal output voltage of the discriminator 38. The comparator produces a pulse train on line 50 which has a duty cycle dependent upon the frequency error $\Delta f$ between the carrier frequency and the present local oscillator frequency. The duty cycle of the pulse train is measured by the digital logic unit 44, which is preferably a microprocessor such as a MC68HC11 manufactured by Motorola, Inc. The pulse train has an on time corresponding to the time period that the level of the demodulated mismatch correction signal is above the nominal output voltage of the discriminator, and an off time corresponding to the time period that the level of the demodulated mismatch correction signal is below the nominal output voltage of the discriminator.

A microprocessor is particularly suited to measuring the on and off times, as most microprocessors are provided with interrupt driven timer counters. The input to the microprocessor can be configured to detect positive edge and negative edge transistions of the pulse train, and store the timer count when these edges are detected. Such timer counters are commonly available on even the most inexpensive microprocessors, and typically have a 16 bit resolution. By measuring frequency deviation in this manner, a much more precise measurement of frequency deviation may be obtained since a 16 bit counter has 16 times the resolution of a 12 bit ADC. By correctly choosing the microprocessor frequency, full use may be made of the timer counter. It is preferred that the period of the mismatch correction signal corresponds to the maximum time period of the timer, although it is contemplated that the microprocessor may keep track of timer roll-overs. The on and off times will be less than the period of the signal.

By comparing these times the duty cycle of the pulse train can be determined. In addition, the direction of the frequency deviation can also be determined. If the on time of the pulse train is greater than the off time, the frequency error is positive, that is, the present local oscillator frequency $f_{lo}$ is greater than the carrier frequency $f_c$. The opposite is true when the off time is greater; the present local oscillator frequency is below the carrier frequency. This of course assumes that the discriminator output increases for a positive frequency error. It may be the case that the opposite is true. In addition to the direction of the frequency error, the amount of the error can be calculated from the duty cycle. A duty cycle of 50%, equal on time and off time, indicates that $f_c$ and the present $f_{lo}$ are matched. When the frequencies are not matched, as will typically be the case initially, the deviation of the duty cycle from 50% indicates the magnitude of the frequency error of the present local oscillator frequency. The digital logic unit could determine the error $\Delta f$, and adjust the local oscillator frequency until $f_{lo}$ is matched with $f_c$. In practice it may not be necessary to compute the error, but simply to recognize the error and adjust the local oscillator until a duty cycle of 50% is obtained.

Figure 2:
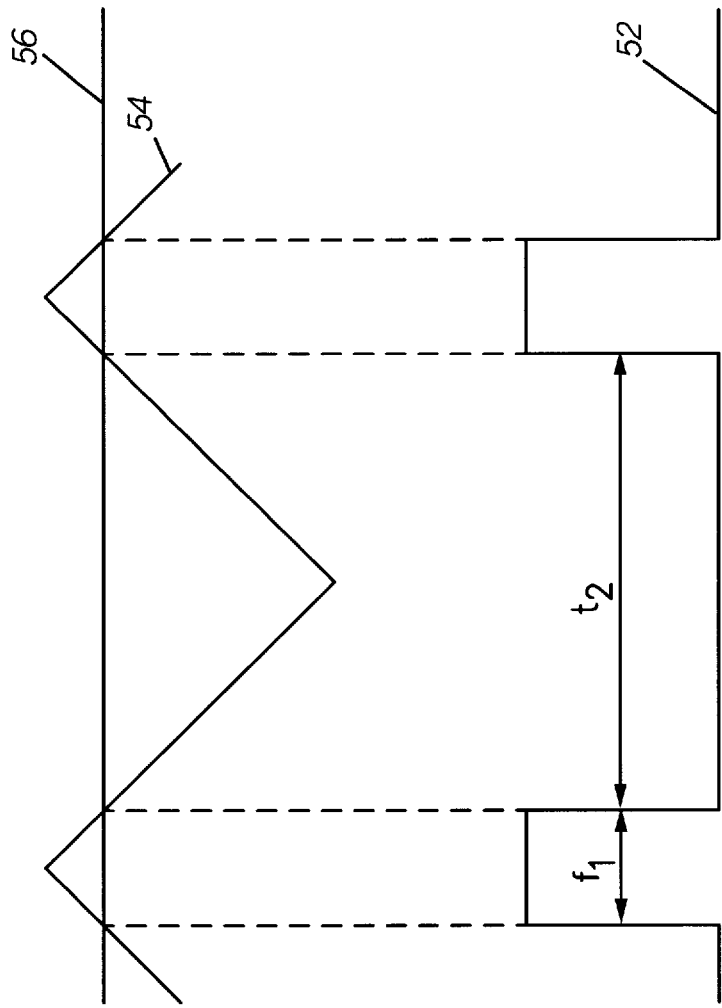
FIG. 2 is a graph illustrating typical mismatch and a pulse train produced in accordance with the invention.
Figure 3:
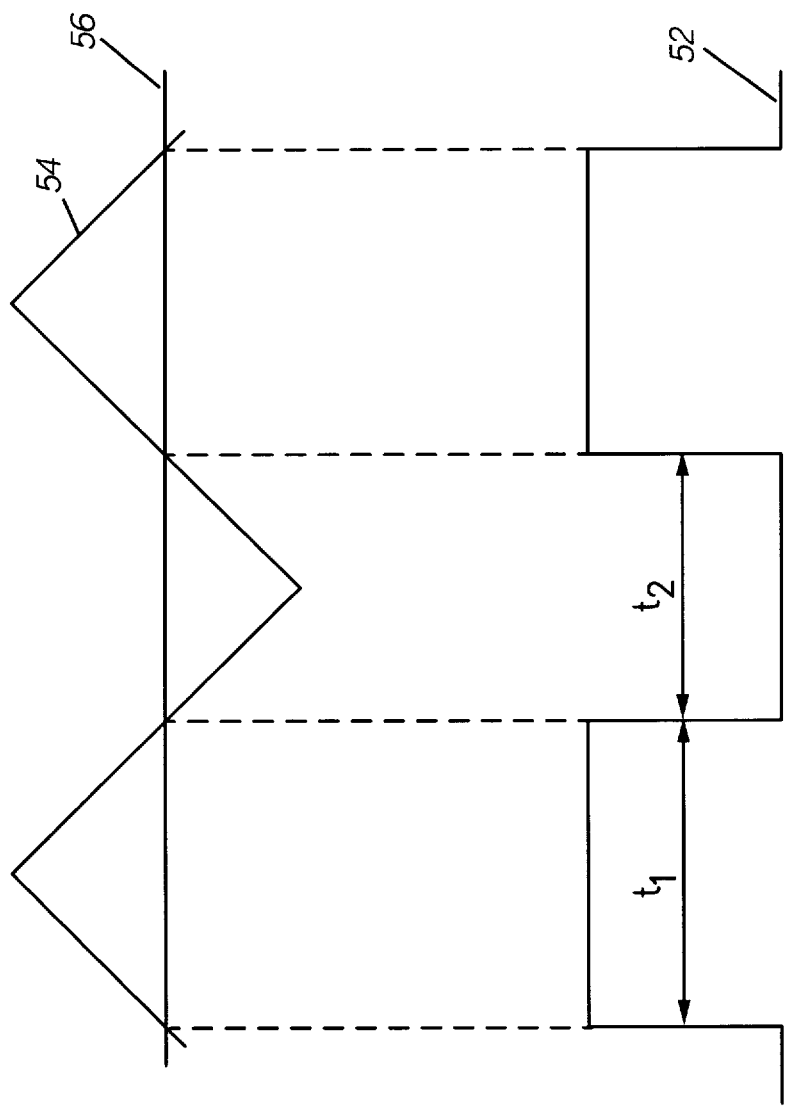
FIG. 3 is a graph illustrating frequency matching and a pulse train produced in accordance with the invention.

To illustrate the wave forms, FIG. 2 illustrates a graph showing typical mismatch and a pulse train 52 produced by the comparator 40 in accordance with the invention. The demodulated mismatch correction signal is shown here as a triangle wave 54, which was originally generated by the signal generator of the transmitter, and could also be a sinusoidal wave. The demodulated mismatch correction signal is compared to the reference voltage level 56 to produce the pulse train 52. In this illustration it can be seen that the average of the demodulated mismatch correction signal is below the reference voltage level. Accordingly, the on time $t_1$ is less than the off time $t_2$. In FIG. 3 the same signals are illustrated after the digital logic unit has corrected the local oscillator frequency. In FIG. 3 the average of the demodulated mismatch correction signal is equal to the reference voltage level, and the on time $t_1$ is equal to the off time $t_2$.

It is contemplated that the output of the comparator may, instead of a pulse train, either continuously high or low. This indicates that the frequency error is so great that peaks of the demodulated mismatch correction signal are completely above or below the reference voltage. In order to avoid ambiguity, it is preferred that the mismatch correction signal be of sufficient amplitude so that even the most extreme frequency error expected produce a pulse train.

By using this type of frequency mismatch correction, the transmitter and receiver can be made less expensively than if the carrier frequency and local oscillator frequency have to be very stable. Furthermore, the receiver can be made at a lower cost since it no longer requires an ADC, and a comparator is a very inexpensive component. The invention apparatus is very useful, especially in inexpensive radio systems, such as automated meter systems. In such systems the transmitter, receiver, or both may experience a wide range of temperatures throughout the year, depending on the particular climate where it is located. Such temperature extremes can cause even crystal based oscillators to shift frequency slightly. However, by use of the invention, a low cost carrier oscillator may be designed for the transmitter.

In practice, the mismatch signal will be initially transmitted so that the local oscillator frequency can be adjusted, followed by an information signal, such as voice or data, for example. When information is being transmitted, the demodulated information signal will be available from line 46, which can then be fed to another part of the receiver, such as an audio amplifier, or a data buffer.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of eliminating frequency mismatch between a transmitter and a receiver, said transmitter transmitting a modulated mismatch correction signal, said method comprising:

receiving said modulated mismatch correction signal in said receiver;

mixing said modulated mismatch correction signal with a local oscillator frequency thereby providing a mixed mismatch correction signal;

demodulating said mixed mismatch correction signal using a discriminator having a nominal output voltage, thereby providing a demodulated mismatch correction signal;

comparing said demodulated mismatch correction signal with said nominal discriminator output voltage, thereby providing a pulse train having a duty cycle; and adjusting said local oscillator frequency until said duty cycle of said pulse train is 50%.

2. A method of eliminating frequency mismatch between a transmitter and a receiver, said transmitter transmitting a modulated mismatch correction signal, said method comprising:

in said transmitter:

generating a mismatch correction signal;

modulating a carrier frequency with said mismatch correction signal, thereby providing a modulated mismatch correction signal;

transmitting said modulated mismatch correction signal to said receiver;

in said receiver:

receiving said modulated mismatch correction signal in said receiver;

mixing said modulated mismatch correction signal with a local oscillator frequency thereby providing a mixed mismatch correction signal;

demodulating said mixed mismatch correction signal using a discriminator having a nominal output voltage, thereby providing a demodulated mismatch correction signal;

comparing said demodulated mismatch correction signal with said nominal discriminator output voltage, thereby providing a pulse train having a duty cycle; and adjusting said local oscillator frequency until said duty cycle of said pulse train is 50%.

3. A method of eliminating frequency mismatch as defined by claim 2, wherein said step of generating is generating a triangle wave as said mismatch correction signal.

4. A method of eliminating frequency mismatch as defined by claim 2, wherein said step of generating is generating a sinusoidal wave as said mismatch correction signal.

5. An apparatus for eliminating frequency mismatch, comprising:

a transmitter comprising;
  a signal generator;
  an FM modulator;
  a carrier oscillator;
  said FM modulator for modulating a carrier frequency provided by said carrier oscillator with a mismatch correction signal provided by said signal generator, thereby providing a modulated mismatch correction signal which is transmitted to a receiver;

said receiver comprising:
  a local oscillator for providing a local oscillator frequency, said local oscillator frequency being adjustable and initially having a frequency error from said carrier frequency;
  a receiver mixer for mixing said modulated mismatch correction signal with said local oscillator frequency, thereby providing a mixed mismatch correction signal;
  a discriminator for converting said mixed mismatch correction signal to a demodulated mismatch correction signal;
  a comparator for comparing said demodulated mismatch correction signal with a reference voltage, thereby providing a pulse train having a duty cycle indicative of said frequency error; and
  a digital logic unit responsive to said frequency error for adjusting said local oscillator until said local oscillator frequency matches said carrier frequency.

6. An apparatus as defined by claim 5, wherein said digital logic unit is a microprocessor.

7. An apparatus as defined by claim 5, wherein said mismatch correction signal is a triangle wave.

8. An apparatus as defined by claim 5, wherein said mismatch correction signal is a sinusoidal wave.

9. An apparatus as defined by claim 5, wherein said discriminator has a nominal output voltage, said reference voltage is equal to said nominal output voltage.

10. An apparatus as defined by claim 5, wherein said local oscillator frequency is offset from said carrier frequency by an intermediate frequency in addition to said frequency error.

* * * * *